(12) United States Patent
Shi et al.

(10) Patent No.: US 12,002,908 B2
(45) Date of Patent: Jun. 4, 2024

(54) LIGHT-EMITTING PACKAGING DEVICE

(71) Applicant: QUANZHOU SANAN SEMICONDUCTOR TECHNOLOGY CO., LTD., Fujian (CN)

(72) Inventors: Junpeng Shi, Fujian (CN); Qiuxia Lin, Fujian (CN); Weng-Tack Wong, Fujian (CN); Changchin Yu, Fujian (CN)

(73) Assignee: QUANZHOU SANAN SEMICONDUCTOR TECHNOLOGY CO., LTD., Fujian (CN)

( * ) Notice: Subject to any disclaimer, the term of this patent is extended or adjusted under 35 U.S.C. 154(b) by 444 days.

(21) Appl. No.: 17/319,757

(22) Filed: May 13, 2021

(65) Prior Publication Data

US 2021/0305471 A1 Sep. 30, 2021

Related U.S. Application Data

(63) Continuation-in-part of application No. PCT/CN2018/116256, filed on Nov. 19, 2018.

(30) Foreign Application Priority Data

Nov. 6, 2020 (CN) .......................... 202022541708.1

(51) Int. Cl.
*H01L 33/00* (2010.01)
*C09D 127/12* (2006.01)
(Continued)

(52) U.S. Cl.
CPC ............ *H01L 33/56* (2013.01); *C09D 127/12* (2013.01); *H01L 33/486* (2013.01); *H01L 33/58* (2013.01);
(Continued)

(58) Field of Classification Search
CPC ....... H01L 33/486; H01L 33/52; H01L 33/56; H01L 33/58; H01L 33/483
See application file for complete search history.

(56) References Cited

U.S. PATENT DOCUMENTS

| 2005/0072981 A1* | 4/2005 | Suenaga | H01L 33/486 |
| | | | 257/E33.059 |
| 2007/0267645 A1* | 11/2007 | Nakata | H01L 33/58 |
| | | | 257/E33.059 |
| 2015/0171291 A1* | 6/2015 | Huang | H01L 33/56 |
| | | | 257/98 |

FOREIGN PATENT DOCUMENTS

| CN | 101079464 A | 11/2007 |
| CN | 204668355 U | 9/2015 |
| JP | 2003318448 | 11/2003 |

OTHER PUBLICATIONS

Search Report issued to PCT application No. PCT/CN2018/116256 by the WIPO on Aug. 20, 2019.
(Continued)

*Primary Examiner* — Reema Patel
(74) *Attorney, Agent, or Firm* — DLA PIPER LLP (US)

(57) ABSTRACT

A light-emitting packaging device includes a substrate, a light-emitting diode (LED) chip, an optical element, and a covering member. The LED chip is disposed on the substrate. The optical element is spacedly disposed on the LED chip opposite to the substrate, and has an upper surface and a lower surface that are respectively distal from and proximal to the LED chip. The covering member is made from a fluorine-containing resin, and is configured to cover the LED chip and at least a portion of the upper surface of the optical element.

22 Claims, 13 Drawing Sheets

(51) Int. Cl.
*H01L 33/48* (2010.01)
*H01L 33/56* (2010.01)
*H01L 33/58* (2010.01)
*H01L 33/60* (2010.01)

(52) U.S. Cl.
CPC ........ *H01L 33/60* (2013.01); *H01L 2933/005* (2013.01); *H01L 2933/0058* (2013.01)

(56) References Cited

OTHER PUBLICATIONS

Search Report appended to an Office Action, which was issued to Chinese counterpart application No. 201880035575.3 by the CNIPA on Jan. 28, 2023, with an English translation thereof.

* cited by examiner

LIGHT-EMITTING PACKAGING DEVICE

CROSS-REFERENCE TO RELATED APPLICATION

This application is a bypass continuation-in-part application of PCT International Application No. PCT/CN2018/116256 filed on Nov. 19, 2018, and claims priority of Chinese Utility Model Patent Application No. 202022541708.1, filed on Nov. 6, 2020. The entire content of each of the International and Chinese patent applications is incorporated herein by reference.

FIELD

The disclosure relates to a light-emitting packaging device, and more particularly to a light-emitting packaging device that exhibits an increased light output efficiency.

BACKGROUND

A light-emitting diode (LED) is a semiconductor solid-state light emitting device. With the development of LED technology, the LEDs are gradually being developed for an ultraviolet (UV) or a deep ultraviolet (DUV) application. It is well known that an UV LED, which serves as a new generation green light source, has many advantages, such as high light output efficiency, long service life, energy-saving, and environmental protection. In addition, the UV LED can be widely applied in various fields, e.g., indoor and outdoor disinfection, back light, UV printing, medical treatment, food hygiene, and plant growth. A conventional packaging structure for the UV LED, in particular for DUV LED, is made of an inorganic material. For example, the packaging structure includes a ceramic substrate in a cup shape for receiving an LED chip, and an optical element which is made of, e.g., quartz glass, and which is spacedly disposed on the LED chip. In such packaging structure, light emitted from the LED chip first enters into the air space between the LED chip and the optical element, and is then transmitted to outside of the packaging structure through the optical element. That is, the emitted light is transmitted from one medium (e.g., optically denser medium) to another medium (e.g., optically thinner medium), which may cause total reflection, and thus greatly decreases light output efficiency of such packaging structure.

To solve the aforementioned problems, referring to FIGS. 1A and 1B, Chinese Invention Patent Application Publication No. CN108134007A discloses an LED packaging structure including a substrate 91, an LED chip 92, an optical element 94 spacedly disposed on the LED chip 92, and a filling member 93 disposed between the LED chip 92 and the optical element 94. The filling member 93 is made from an amorphous fluorine-containing resin material that has a refractive index (e.g., ranging from 1.3 to 1.6) higher than a refractive index of air. Therefore, in such LED packaging structure, a light emitted from the LED chip 92 passes through the filling member 93 (rather than the air) to reduce total reflection, and is then transmitted to outside of the LED packaging structure through the optical element 94. As such, the LED packaging structure exhibits an improved light output efficiency.

However, as shown in FIG. 1B, during the formation of the filling member 93, the amorphous fluorine-containing resin material for filling the space between the LED chip 92 and the optical element 94 is in a liquid form, and might have bubbles that are difficult to be released, which might adversely affect the light output efficiency of the resultant LED packaging structure. Moreover, an adhesion between the optical element 94 and the filling member 93 might also be reduced due to the presence of the bubbles, and thus the optical element 94 of the LED packaging structure might be easily deformed during a reflow process.

SUMMARY

Therefore, an object of the disclosure is to provide a light-emitting packaging device that can alleviate or eliminate at least one of the drawbacks of the prior art.

According to the disclosure, a light-emitting packaging device includes a substrate, a light-emitting diode (LED) chip, an optical element, and a covering member.

The LED chip is disposed on the substrate.

The optical element is spacedly disposed on the LED chip opposite to the substrate, and has an upper surface and a lower surface that are respectively distal from and proximal to the LED chip.

The covering member is made from a fluorine-containing resin, and is configured to cover the LED chip and at least a portion of the upper surface of the optical element.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1A:
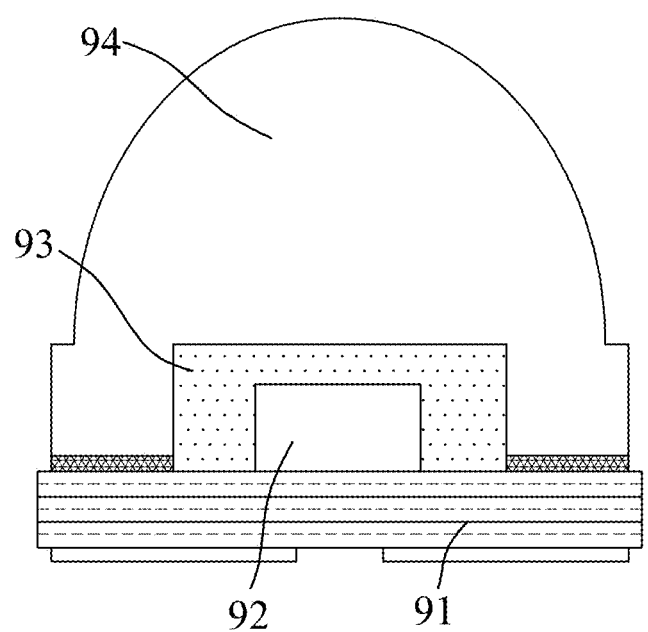
FIGS. 1A and 1B are schematical views illustrating a conventional light-emitting diode (LED) packaging structure.
Figure 1B:
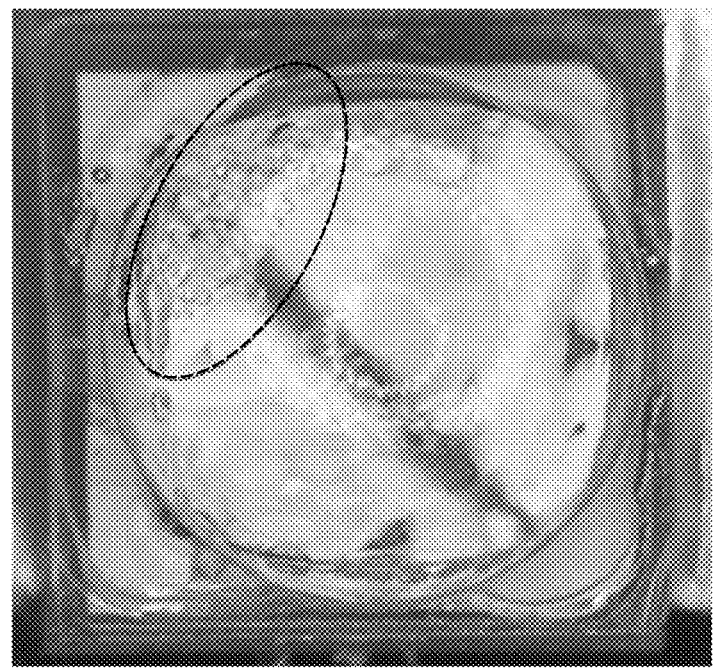

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
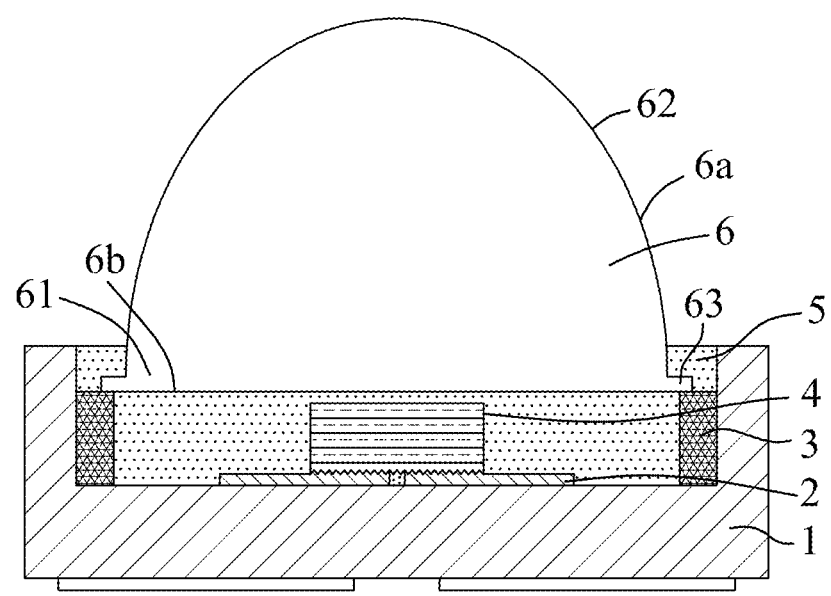
FIG. 2 is a schematic view illustrating a first embodiment of a light-emitting packaging device according to the disclosure.

Referring to FIG. 2, a first embodiment of a light-emitting packaging device according to the present disclosure includes a substrate 1, a light-emitting diode (LED) chip 4, an optical element 6, and a covering member 5.

To achieve a desired heat dissipation effect, in certain embodiments, the substrate 1 may be made of an insulating material, which includes, but is not limited to, a ceramic material, such as low temperature co-fire ceramic (LTCC) and high temperature co-fire ceramic (HTCC). In other embodiments, the substrate 1 may be made of metal nitride (e.g., aluminium nitride (AlN)) having a thermal conductivity that is not smaller than 140 W/(m·k).

The LED chip 4 is disposed on the substrate 1. The LED chip 4 may be a face-up LED chip, a flip-chip LED chip, or a vertical LED chip. The LED chip 4 may be configured to emit ultraviolet (UV) light having an emission peak wavelength that is not greater than 385 nm. In certain embodiments, the emission peak wavelength of the LED chip 4 ranges from 200 nm to 380 nm, such as from 315 nm to 380 nm (i.e., long wave UV (UV-A)), from 280 nm to 315 nm (i.e., medium wave UV (UV-B)) and from 200 nm to 280 nm (i.e., short wave UV (UV-C)). The emission peak wavelength of the LED chip 4 may be varied according to practical requirements (e.g., for the purpose of surface sterilization or surface curing). The number of the LED chip 4 is not particularly limited, and may be varied according to practical needs and application, such as power requirements. For example, the light-emitting packaging device may have a plurality of the LED chips 4 emitting UV lights having different emission peak wavelengths. Alternatively, the light-emitting packaging device may have at least one LED chip 4 emitting UV light and another LED chip that emits non-UV light. A projection of the LED chip 4 on the substrate 1 falls within the substrate 1. That is, the LED chip 4 is entirely disposed on the substrate 1.

The optical element 6 is spacedly disposed on the LED chip 4 opposite to the substrate 1, and has an upper surface 6a and a lower surface 6b that are respectively distal from and proximal to the LED chip 4. The optical element 6 may be made of quartz glass. In this embodiment, the optical element 6 includes a base 61 and a lens 62 which extends from the base 61. The lens 62 may include a curved surface serving as the upper surface 6a of the optical element 6, and the base 61 may have a flat surface serving as the lower surface 6b of the optical element 6. An imaginary line connecting a geometric center of the optical element 6 to a geometric center of a light-emitting surface of the LED chip 4 may be perpendicular to the light-emitting surface of the LED chip 4, such that light can be uniformly scattered from the optical element 6 at various angles. It is noted that the larger the size of the optical element 6 relative to that of the LED chip 4, the closer the position of the LED chip 4 to the geometric center of the optical element 6. As such, light emitted from the LED chip 4 can be sequentially transmitted through the covering member 5 (which will be described in detail hereinafter) and the optical element 6, and exits outside of the light-emitting packaging device from the upper surface 6a in a relatively smaller emitting angle, so as to reduce the light reflection, thereby increasing the light output efficiency.

The covering member 5 is made from a fluorine-containing resin, and is configured to cover the LED chip 4 and at least a portion of the upper surface 6a of the optical element 6.

The fluorine-containing resin of the covering member 5 may have a refractive index that is greater than that of air, such as ranging from 1.3 to 1.6 (e.g., 1.34). In certain embodiments, the refractive index of the fluorine-containing resin of the covering member may be between a refractive index of the LED chip 4 and a refractive index of the optical element 6 (e.g., made of glass), such that total reflection at interfaces therebetween can be effectively reduced, so as to increase a direct light output efficiency.

The fluorine-containing resin of the covering member 5 is a stable resin that is resistant to UV radiation and that has a relatively high transmittance. In certain embodiments, the fluorine-containing resin may be non-crystalline (i.e., amorphous). The fluorine-containing resin may include a homopolymer, or alternatively include a copolymer (e.g., perfluorinated alkyl vinyl ether copolymer, perfluorinated ethylene-propylene (FEP) copolymer, or ethylene-tetrafluoroethylene (ETFE) copolymer). In such case, the homopolymer and the copolymer may include a structural unit having fluorine-containing aliphatic ring, which is conducive for amorphization and enhancing the transparency of the fluorine-containing resin of the covering member 5.

Examples of the structural unit having fluorine-containing aliphatic ring may include, but are not limited to, a cyclic fluoromonomer unit, a cyclic unit formed through a cyclization polymerization of a diene-based fluoromonomer, and a combination thereof.

In certain embodiments, the cyclic fluoromonomer unit has a polymerizable double bond formed between the carbon atoms of the fluorine-containing aliphatic ring. In other embodiments, the cyclic fluoromonomer unit has a polymerizable double bond formed between a carbon atom of the fluorine-containing aliphatic ring and a carbon atom of a substitute group of the fluorine-containing aliphatic ring. The fluorine-containing aliphatic ring may include at least one etheric oxygen atom (—O—), such as two etheric oxygen atoms within the ring skeleton thereof. For example, the cyclic fluoromonomer unit is a perfluorinated oxygen-containing heterocyclic compound.

The fluorine-containing resin may include a copolymer made from the abovementioned cyclic fluoromonomer unit and other monomers. Examples of such other monomers may include, but are not limited to, diene fluorinated monomer, tetrafluoroethylene, trifluorochloroethylene, perfluoro(methyl vinyl ether), perfluoro(ethyl vinyl ether), perfluoro(propyl vinyl ether), and combinations thereof). A ratio of the cyclic fluoromonomer unit to all repeating units that constitute the copolymer may be greater than 20 mol %, such as greater than 40 mol %.

The diene fluorinated monomer may include two polymerizable double bonds and a fluorine atom. The polymerizable double bond may include vinyl, allyl, acryl, methacryloyl, etc. In certain embodiments, the diene fluorinated monomer is a perfluoroolefin. For example, the diene fluorinated monomer is represented by the following formula:

$$CF_2=CF-Q-CF=CF_2,$$

wherein Q may be a perhalo alkylene group which has an etheric oxygen atom and which has the number of carbon atoms ranging from 1 to 3.

The fluorine-containing resin may be a homopolymer made from the diene fluorinated monomer, or a copolymer made from the diene fluorinated monomer and other monomers. In such case, a ratio of the diene fluorinated monomer to all repeating units of the copolymer may be greater than 50 mol %, such as 80 mol %. The fluorine-containing resin may have an average molecular weight ranging from 3000 g/mol to 100000 g/mol, such as from 10000 g/mol to 300000 g/mol and from 100000 g/mol to 250000 g/mol.

In certain embodiments, the fluorine-containing resin of the covering member 5 is an amorphous fluorine-containing resin having a crystallinity that is not greater than 10%, and is represented by the following formula:

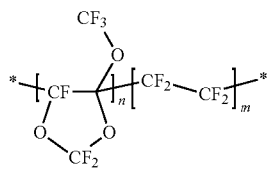

wherein a percentage of n to (n+m) may range from 40% to 60%.

Figure 10:
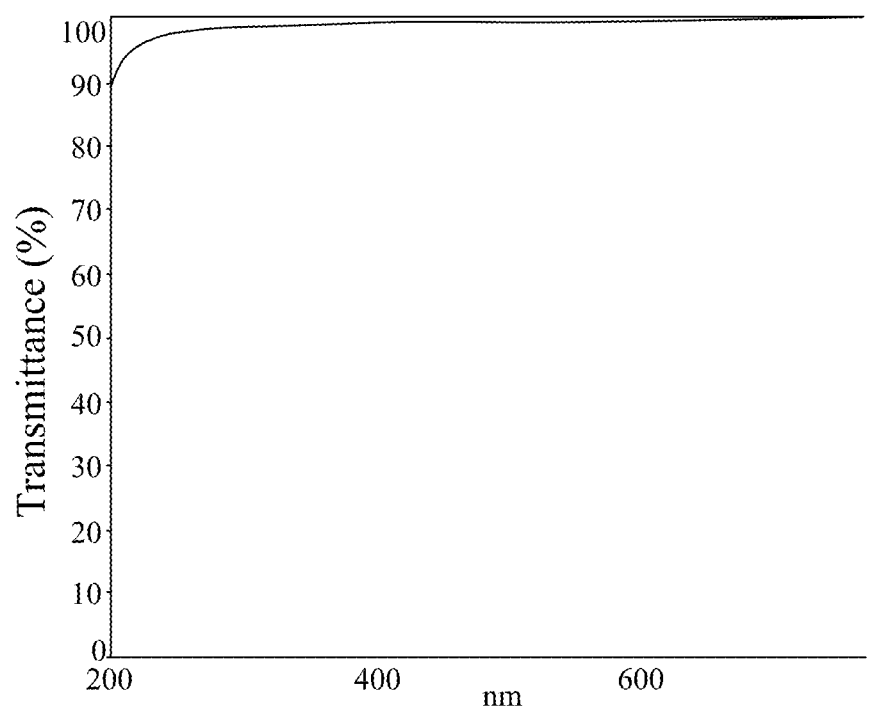
FIG. 10 is a plot showing a spectral transmittance curve of a covering member of the first embodiment according to the disclosure.

The amorphous fluorine-containing resin exhibits a high temperature stability, a good hydrophobicity, a good chemical resistance, and a high solubility and a low solution viscosity in a fluorinated solvent. In certain embodiments, the fluorine-containing resin has an imaginary part of complex refractive index that is lower than 0.001 at a wavelength of 300 nm, such that the covering member 5 can have an improved transmittance when exposed to UV or DUV radiation. In this embodiment, a percentage of n to (n+m) in the above formula of the fluorine-containing resin is 60%, and the resultant covering member 5 has a refractive index of 1.327 and a glass transition temperature of 125° C. In addition, it can be deduced from a spectral transmittance curve of the covering member 5 as shown in FIG. 10 that, the transmittance of the covering member 5 may reach 90% at a wavelength of greater than 200 nm, and even greater than 95% at a wavelength ranging from 275 nm to 285 nm.

In certain embodiments, the fluorine-containing resin of the covering member 5 includes a copolymer obtained by copolymerization of a perfluorinated oxygen-containing heterocyclic compound and a perfluoroolefin.

The light-emitting packaging device may further include two metal contact electrodes 2 that are disposed on the substrate 1 for electrically connecting to two electrodes of the LED chip 4 by e.g., wire bonding or soldering. The metal contact electrodes 2 may be used for external electrical connection.

In this embodiment, the substrate 1 is formed with a recess (i.e., in a shape of a cup). The recess is defined by a recess-defining wall that has a bottom wall and a surrounding wall extending upwardly from the bottom wall. The substrate 1 may be made of a combination of a ceramic material and a metallic material. The metal contact electrodes 2 are disposed on the bottom wall of the recess-defining wall. The LED chip 4 is disposed within the recess. The covering member 5 is configured to fill a portion of the recess that is beneath the lower surface 6b of the optical element 6, and to cover a portion of the upper surface 6a of the optical element 6.

Figure 3:
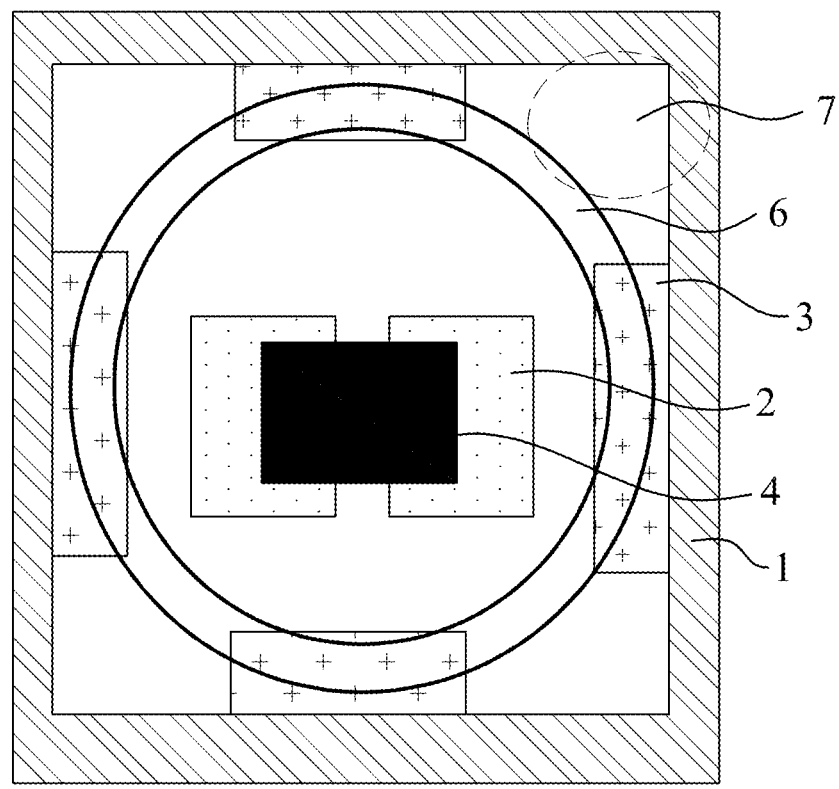
FIG. 3 is a schematic top view illustrating the first embodiment of the light-emitting packaging device according to the disclosure.

The surrounding wall of the recess-defining wall and the upper surface 6a of the optical element 6 cooperatively define a gap 7 (see FIG. 3). The covering member 5 is configured to further fill the gap 7.

The light-emitting packaging device may further include a platform unit 3 protruding upwardly from the bottom wall and along the surrounding wall, and the optical element 6 is supported by the platform unit 3. In certain embodiments, the platform unit 3 includes a plurality of platforms that are spaced apart from each other. Each of the platforms may have an identical height. In such case, only a portion of the optical element 6 is supported by the platform unit 3, and the remaining portion of the optical element 6 that is free from being supported by the platform unit 3 is in cooperation with the surrounding wall of the recess-defining wall to define the gap 7. The platform unit 3 may be made of a material that is identical to or different from that of the substrate 1. For example, the platform unit 3 may be made of a ceramic material (e.g., AlN) or a metallic material that has a reflectivity that is higher than that of AlN. The platform unit 3 may have a height which is greater than that of the LED chip 4 and which is lower than that of the surrounding wall of the recess-defining wall. That is, the platform unit 3 is located at a position that is above the light-emitting surface of the LED chip 4 and that is beneath a top end of the surrounding wall opposite to the bottom wall.

Figure 7:
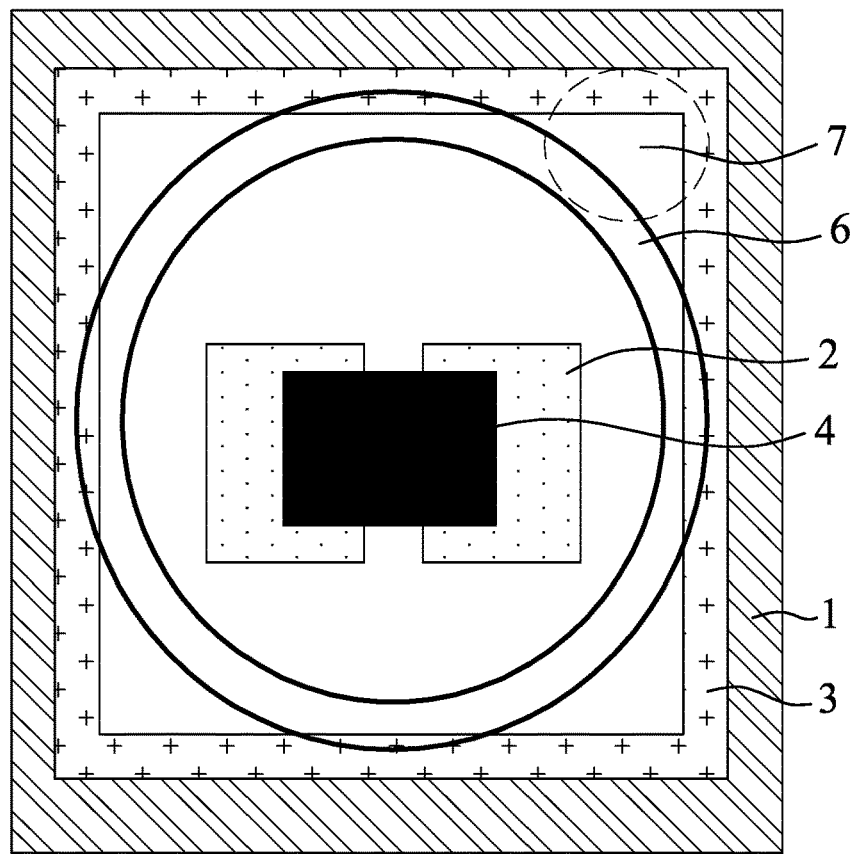
FIG. 7 is a schematic top view illustrating another variation of the first embodiment.

The recess-defining wall may have a rectangular cross-section. In this embodiment, the platform unit 3 includes four platforms that are spaced apart from each other and that have an identical height. Each of the four platforms protrudes upwardly from the bottom wall and along a respective one of four sides of the recess-defining wall. In a variation of the first embodiment, the platform unit 3 is in an annular shape (see FIG. 7). A distance between the LED chip 4 and the optical element 6 may be varied by adjusting the height of the platform unit 3, so as to control alight emitted from the LED chip 4 to be near perpendicularly transmitted into the optical element 6.

In order to enhance the adhesion of the optical element 6 to the platform unit 3, the light-emitting packaging device may further include at least one adhesive layer (not shown) that is disposed between the platform unit 3 and the optical element 6. The adhesive layer may be formed as one of a single layer structure and a multi-layered structure. The adhesive layer may also be made of the fluorine-containing resin. Alternatively, the adhesive layer may be made of a material that is different from that of the covering member 5. The adhesive layer may have an adhesion to the optical element 6 that is greater than an adhesion of the covering member 5 to the optical element 6. The adhesion strength of the adhesive layer may not be smaller than 2 MPa. The adhesive layer may have a thickness that is not greater than 5 μm.

Figure 4:
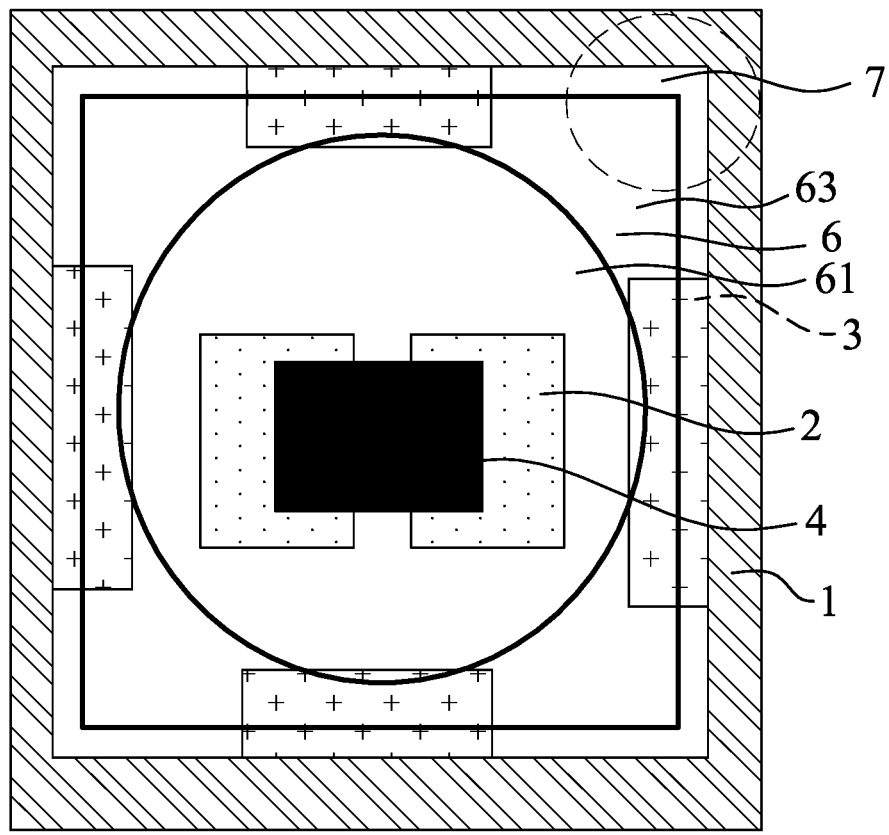
FIG. 4 is a schematic top view illustrating a variation of the first embodiment.

The optical element 6 may further include a flange 63 which laterally extends from the base 61, and which is partially supported by the platform unit 3, so as to increase an adhesion area of the optical element 6, thereby enhancing an adhesion of the optical element 6 to the covering member 5, and avoiding the detachment of the optical element 6 when the light-emitting packaging device undergoes vibration. A portion of the flange 63 that is free from being supported by the platform unit 3 is in cooperation with the surrounding wall of the recess-defining wall to define the gap 7 (i.e., shown in FIG. 4). In this embodiment, a projection of the flange 63 and the base 61 is in a shape (i.e., annular shape) conforming to that of the lens 62, and the gap 7 is shown by the dotted lines in FIG. 3. In a variation of the first embodiment, a projection of the flange 63 and the base 61 is in a rectangular shape, which is the same as that of the cross-section of the recess-defining wall (see FIG. 4). The covering member 5 fills the gap 7, and covers the flange 63 and the at least a portion of the upper surface 6a of the optical element 6, so that the bubbles of the covering member 5 that may be present beneath the optical element 6 can be released to the atmosphere, and an engagement structure may be formed between the covering member 5 and the optical element 6. A horizontal distance between the flange 63 of the optical element 6 and the surrounding wall may be not smaller than 20 μm.

In certain embodiments, a portion of the flange 63 (e.g., an upper surface, a lower surface, and/or a side surface thereof) is roughened to have a roughness that is not smaller than 0.2 μm. Such portion of the flange 63 to be roughened may be located at a region of the flange 63 in contact with the platform unit 3 to increase the adhesion of the flange 63 to the platform unit 3, and/or located at a region in contact with the covering member 5 to increase an engagement strength of the flange 63 and the covering member 5.

Figure 5:
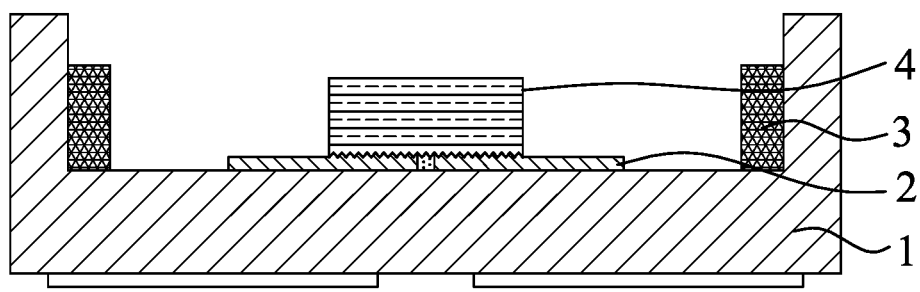
FIGS. 5 and 6 are schematic views illustrating consecutive steps of a method for manufacturing the first embodiment of the light-emitting packaging device according to the disclosure.
Figure 6:
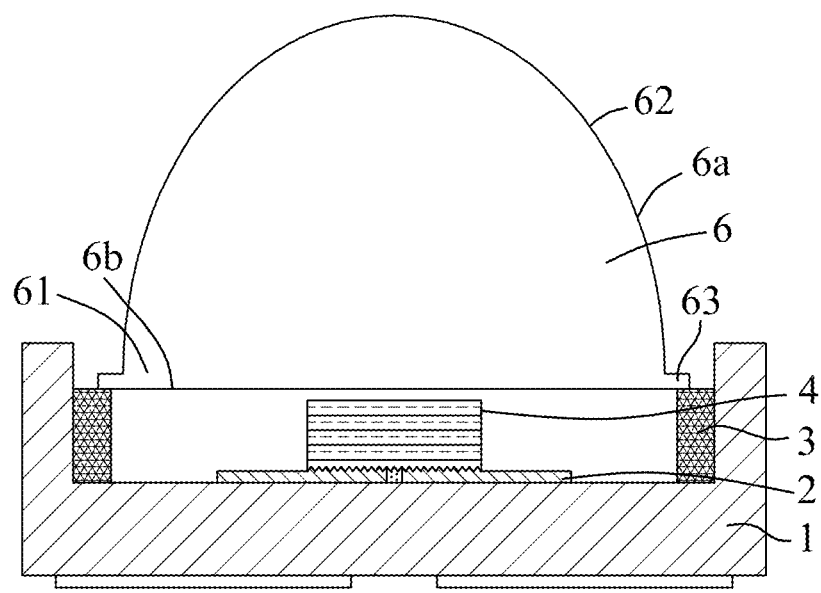

Referring to FIGS. 5 and 6, a method for manufacturing the first embodiment of the light-emitting packaging device according to the disclosure is described as follows.

Specifically, referring to FIG. 5, the LED chip 4 (e.g., flip-chip LED chip) which may be diced from a wafer is disposed on and electrically connected to the metal contact electrodes 2 that are disposed on the bottom wall of the recess-defining wall.

Referring to FIG. 6, the lower surface 6b (i.e., the flat surface) of the optical element 6 is adhered to the platform unit 3 through the adhesive layer (not shown). The remaining portion of the optical element 6 that is free from being supported by the platform unit 3 is in cooperation with the surrounding wall of the recess-defining wall to define the gap 7.

Afterwards, a fluorine-containing solution is prepared by dissolving the amorphous fluorine-containing resin in a fluorine-containing solvent. The fluorine-containing solvent may be an aprotic fluorine-containing solvent, which includes, but is not limited to, polyfluorinated aromatic compound, polyfluorotrialkylamine, polyfluoro aliphatic hydrocarbons, polyfluoro cyclic ether, hydrofluoroether (HFE), and combinations thereof. In certain embodiments, the fluorine-containing solvent has an average molecular weight that is not greater than 1000 g/mol. It is noted that when the molecular weight of the fluorine-containing solvent is increased (e.g., greater than 1000 g/mol), the amorphous fluorine-containing resin may have a decreased solubility in the fluorine-containing solvent and the resultant fluorine-containing solution may exhibit an increased viscosity. In addition, in order to increase the solubility of the amorphous fluorine-containing resin, the fluorine-containing solvent may have a fluorine content ranging from 60 wt % to 80 wt % based on the total weight of the fluorine-containing solvent.

The fluorine-containing solution is introduced into the recess through the gap 7 to fill a portion of the recess that is beneath the lower surface 6b of the optical element 6 and to cover the LED chip 4, the metal contact electrodes 2, a peripheral region (i.e., the flange 63) of the optical element 6, and at least a portion of the upper surface 6a of the optical element 6. Then, the fluorine-containing solution is cured under heating to evaporate the fluorine-containing solvent, and is then cooled to room temperature, so as to form the covering member 5 in a solid form. To reduce the presence of the bubbles within the covering member 5, the fluorine-containing solution is slowly heated from a temperature below a boiling point of the fluorine-containing solvent (e.g., about room temperature) to a temperature above the boiling point of the fluorine-containing solvent (e.g., about 200° C.), such that the bubbles in the fluorine-containing solution can be effectively released to the atmosphere through the gap 7.

The resultant covering member 5 is configured to fill a portion of the recess that is beneath the lower surface 6b of the optical element 6, and to cover the flange 63 and at least a portion of the upper surface 6a of the optical element 6, so as to securely fix the optical element 6 to the platform unit 3, thereby effectively avoiding the detachment of the optical element 6 due to aging of the adhesive layer after long-term use or long-term exposure to UV radiation. Therefore, the light-emitting packaging device of this disclosure may exhibit an improved light output efficiency, and an increased reliability.

Figure 8:
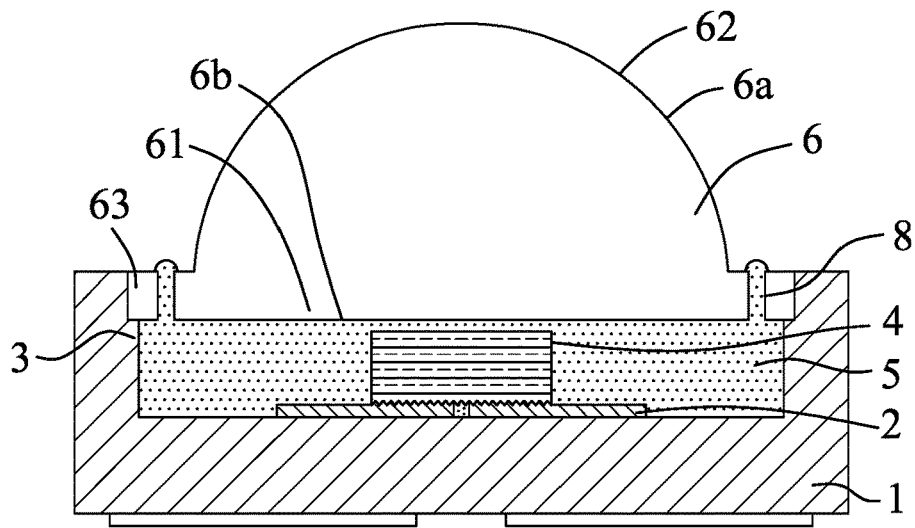
FIG. 8 is a schematic view illustrating a second embodiment of the light-emitting packaging device according to the disclosure.

Referring to FIG. 8, a second embodiment of the light-emitting packaging device according to the present disclosure is generally similar to the first embodiment, except that in the second embodiment, the optical element 6 further has at least one through hole 8 penetrating from the upper surface 6a to the lower surface 6b. In addition, the covering member 5 is configured to further fill the at least one through hole 8 to cover a portion of the upper surface 6a of the optical element 6.

Specifically, in this embodiment, the optical element 6 have a plurality of the through holes 8 which may be uniformly or non-uniformly distributed in the optical element 6. For example, the through holes 8 are distributed in two opposite sides of the optical element 6. Each of the through holes 8 is located at a position that is above the recess, and that is near a peripheral region of the optical element 6 (i.e., away from the geometric center of the optical element 6). Each of the through holes 8 may be independently in one of a circle shape, an elliptical shape, and a polygonal shape. Each of the through holes 8 may have a diameter that is not smaller than 20 μm, such as ranging from 100 μm to 1 mm. The through hole 8 is defined by a hole-defining surface that may be roughened and that may have a roughness that is not smaller than 0.2 μm, such that the optical element 6 can be effectively attached to the covering member 5 in an engaging manner.

By virtue of the covering member 5 that is disposed between the optical element 6 and the LED chip 4 and that further fills the through holes 8 to cover a portion of the upper surface 6a of the optical element 6, the optical element 6 can be effectively attached to the platform unit 3 and the covering member 5 in an engaging manner. In addition, when the fluorine-containing solution is cured under heating (i.e., a high temperature curing process), the bubbles in the fluorine-containing solution can be more effectively released to the atmosphere through not only the gap 7 but also the through holes 8, such that the resultant covering member 5 can be fully filled between the LED chip 4 and the optical element 6, which is conducive for increasing the light output efficiency of the light-emitting packaging device.

Figure 9:
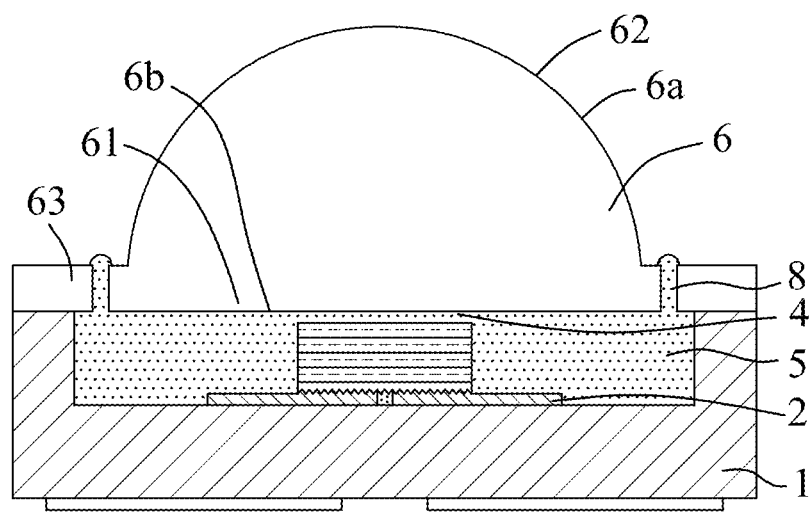
FIG. 9 is a schematic view illustrating a third embodiment of the light-emitting packaging device according to the disclosure.

Referring to FIG. 9, a third embodiment of the light-emitting packaging device according to the present disclosure is generally similar to the second embodiment, except that in the third embodiment, the optical element 6 is disposed on the top end of the surrounding wall opposite to the bottom wall. The light-emitting packaging device may further include the adhesive layer (not shown) that is disposed between the optical element 6 and the top end of the surrounding wall opposite to the bottom wall. The adhesive layer may be formed as a single layer structure or a multi-layered structure.

Figure 11:
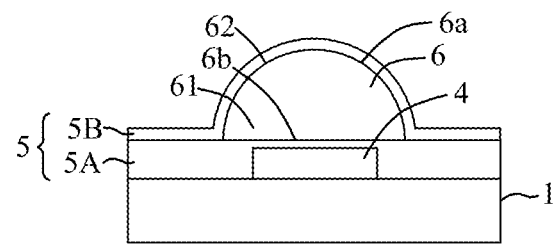
FIG. 11 is a schematic view illustrating a fourth embodiment of the light-emitting packaging device according to the disclosure.

Referring to FIG. 11, a fourth embodiment of the light-emitting packaging device according to the present disclosure is generally similar to the first embodiment, except for the following differences.

Specifically, the substrate 1 is not recessed, and has a flat substrate surface. The LED chip 4 is disposed on the substrate surface. The covering member 5 includes a first fluorine-containing layer 5A and a second fluorine-containing layer 5B.

The first fluorine-containing layer 5A is disposed on the substrate surface of the substrate 1, and covers the LED chip 4. The first fluorine-containing layer 5A directly covers an upper surface and a side surface of the LED chip 4, and cooperates with the LED chip 4 to entirely cover the substrate surface of the substrate 1, so as to provide an improved sealability. In certain embodiments, the first fluorine-containing layer 5A has a flat upper surface spaced apart from the LED chip 4. That is, the first fluorine-containing layer 5A has a thickness measured from the substrate 1 to the flat upper surface that is greater than a thickness of the LED chip 4. The first fluorine-containing layer 5A may be made of light-transmissive fluorine-containing resin, such as fluorinated ethylene propylene (FEP), perfluoroalkoxy (PFA), or ethylene-tetra-fluoro-ethylene (ETFE), and may have a refractive index of 1.34. As such, the first fluorine-containing layer 5A has a high transmittance to UV light and a good reliability, so as to effectively increase a brightness of the light-emitting packaging device.

Figure 12:
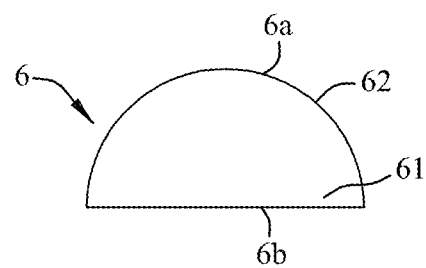
FIGS. 12 and 13 are schematic views respectively illustrating an optical element used in the fourth embodiment, and a variation thereof.

The optical element 6 is disposed on the first fluorine-containing layer 5A opposite to the substrate 1, and is located at a position above the LED chip 4, which is conducive for increasing the light-emitting efficiency of the light-emitting packaging device. Referring further to FIG. 12, the lens 62 of the optical element 6 is a hemi lens, and the upper surface 6a of the optical element 6 is a curved surface. In other embodiments, the upper surface 6a of the optical element 6 may be in other shape, such as cone, i.e., the lens 62 is a conical lens.

The optical element 6 may have a size that is larger than that of the LED chip 4. That is to say, a projection of the optical element 6 on the substrate 1 may fully cover a projection of the LED chip 4 on the substrate 1. Similar to the first embodiment, an imaginary line connecting a geometric center of the optical element 6 to a geometric center of the light-emitting surface of the LED chip 4 is perpendicular to the light-emitting surface of the LED chip 4, so as to improve the light convergence, and to increase the light brightness of the light-emitting packaging device.

The second fluorine-containing layer 5B is disposed on the first fluorine-containing layer 5A opposite to the substrate 1, and covers a portion of the upper surface 6a of the optical element 6. In this embodiment, the second fluorine-containing layer 5B entirely covers the upper surface 6a of the optical element 6 and the flat upper surface of the first fluorine-containing layer 5A. The second fluorine-containing layer 5B may have an uniform thickness. That is, a portion of the second fluorine-containing layer 5B which covers the upper surface 6a of the optical element 6 has a shape conforming with the upper surface 6a (i.e., curved surface) of the optical element 6, and has a thickness substantially identical to a thickness of a portion of the second fluorine-containing layer 5B which covers the flat upper surface of the first fluorine-containing layer 5A. Therefore, the light-emitting packaging device is capable of providing an improved light convergence efficiency and an improved light-emitting efficiency.

The second fluorine-containing layer 5B and the first fluorine-containing layer 5A may be made of an identical material, thereby improving an adhesion therebetween. It should be noted that in other embodiments, the second fluorine-containing layer 5B and the first fluorine-containing layer 5A may be made of different materials.

In certain embodiments, the first fluorine-containing layer 5A directly contacts with the lower surface 6b of the optical element 6 and the LED chip 4. As such, lights emitted from the LED chip 4 would not pass through the air before entering into the second fluorine-containing layer 5B or exiting from the optical element 6, which is conducive for reducing total reflection and increasing a radiation power of the light-emitting packaging device. In addition, the upper surface 6a the optical element 6 may directly contact with the second fluorine-containing layer 5B, such that lights emitted from the LED chip 4 would sequentially pass through the first fluorine-containing layer 5A, the optical element 6 and the second fluorine-containing layer 5B (i.e., without passing through the air) and then exits from the light-emitting packaging device, which is further conducive for reducing total reflection and increasing a radiation power of the light-emitting packaging device. It should be noted that the upper surface 6a of the optical element 6 may be indirectly contact with the second fluorine-containing layer 5A. For example, an air space may be present between the optical element 6 and the second fluorine-containing layer 5A.

Figure 13:
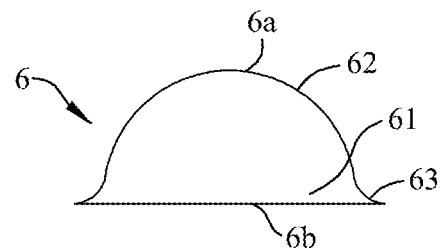

Referring to FIG. 13, in a variation of the fourth embodiment, the optical element 6 further includes the flange 63 that laterally extends from the base of the optical element 6. The flange 63 may have a thickness that is gradually reduced in a direction away from the geometric center of the optical element 6. It should be noted that the material for making the first fluorine-containing layer 5A and the second fluorine-containing layer 5B may have a relatively low surface energy, which may result in a poor adhesion to other materials. Therefore, by virtue of the flange 63 of the optical element 6, a contact area between the optical element 6 and the first fluorine-containing layer 5A and a contact area between the optical element 6 and the second fluorine-containing layer 5B can be further increased, so as to increase the adhesion strength thereamong.

By virtue of the second fluorine-containing layer 5B disposed on the first fluorine-containing layer 5A and covering the LED chip 4, the light-emitting packaging device can have an increased light-emitting efficiency and a good resistance to UV radiation. In addition, the first fluorine-containing layer 5A cooperates with the second fluorine-containing layer 5B to cover the substrate surface of the substrate 1, and to enclose the LED chip 4 and the optical element 6, thereby improving sealability of the light-emitting packaging device.

Figure 14:
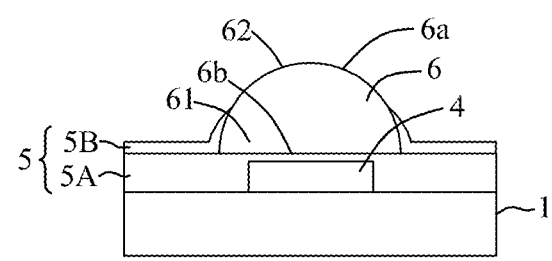
FIG. 14 is a schematic view illustrating a fifth embodiment of the light-emitting packaging device according to the disclosure.

Referring to FIG. 14, a fifth embodiment of the light-emitting packaging device according to the present disclosure is generally similar to the fourth embodiment, except that the second fluorine-containing layer 5B does not entirely cover the upper surface 6a of the optical element 6. An area of the upper surface 6a of the optical element 6 which is covered by the second fluorine-containing layer 5B may account for ⅕ to ⅘ (i.e., 20% to 80%) of a total area of the upper surface 6a of the optical element 6. Such coverage area can be adjusted according to practical requirements. In certain embodiments, the optical element 6 is disposed on the flat upper surface of the first fluorine-containing layer 5A, and the second fluorine-containing layer 5B does not cover the flat upper surface of the first fluorine-containing layer 5A, and only covers a portion of the upper surface 6a of the optical element 6, e.g., radially extending from the base 61 of the optical element 6 in a direction away from the flat upper surface of the first fluorine-containing layer 5A. In other embodiments, the first fluorine-containing layer 5A may be recessed to form a recessed region for receiving the optical element 6.

Figure 15A:
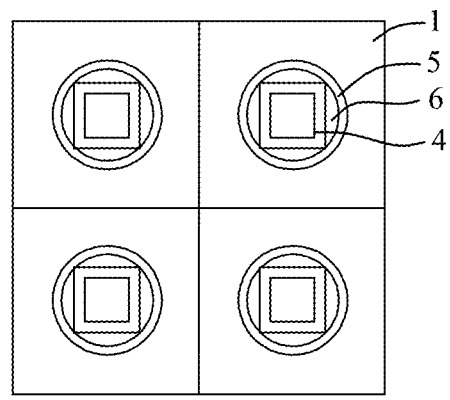
FIGS. 15A and 15B are respectively schematic top and side views illustrating a light-emitting element including the light-emitting packaging device according to the disclosure.
Figure 15B:
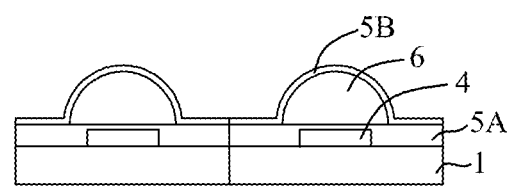
Figure 16:
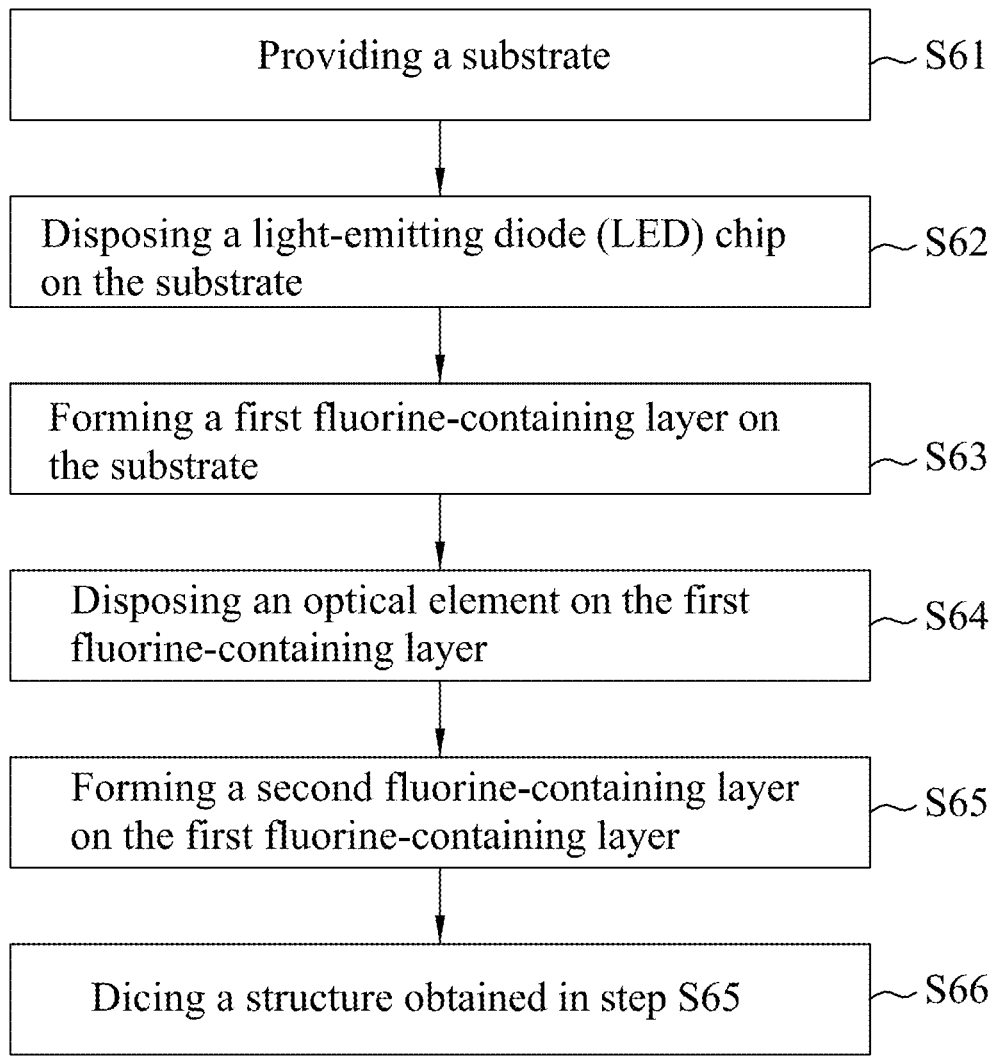
FIG. 16 is a flow chart illustrating a method for making the fourth embodiment of the light-emitting packaging device according to the disclosure.

Referring to FIGS. 15A and 15B, a light-emitting element according to the present disclosure is provided, and includes a plurality of the aforementioned light-emitting packaging devices of this disclosure (e.g., the fourth embodiment of the light-emitting packaging device). The light-emitting packaging devices may be arranged in an array, which may include at least one row and/or at least one column, such as two rows and two columns.

Referring to FIGS. 16 and 17A to 17F, a method for manufacturing the fourth embodiment according to the disclosure includes the following consecutive steps S61 to S66.

Figure 17A:
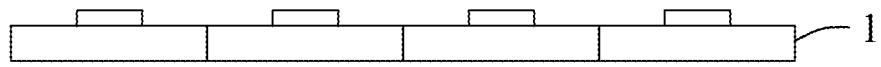
FIGS. 17A to 17F are schematic side views illustrating the consecutive steps of the method for making the fourth embodiment of the light-emitting packaging device of this disclosure.

In step S61, as shown in FIG. 17A, the substrate 1 is provided. The substrate 1 can be used to form a plurality of the light-emitting packaging devices that are arranged in an array, such as in a row or in a plurality of rows. A size of the substrate 1 may vary depending on the number of the light-emitting packaging devices to be formed. A thickness of the substrate 1 can also be adjusted according to practical requirements. The substrate 1 may be divided into a plurality of chip areas, each of which may have the same or different size according to practical requirements. For example, each of the chip areas has the same size, and is configured for forming one light-emitting packaging device. Each of the chip areas of the substrate 1 may be marked on a peripheral region thereof (i.e., formation of scribing lines) for assisting the subsequent dicing process.

In certain embodiments, the substrate surface of the substrate 1 is subjected to a pretreatment. For example, the substrate surface is subjected to a patterning pretreatment, so as to form a patterned substrate to increase an adhesion between the substrate 1 and the first fluorine-containing layer 5A to be disposed thereon.

Figure 17B:
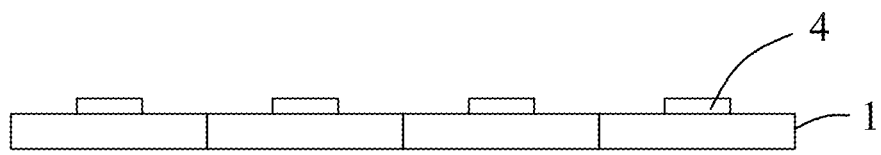

In step S62, as shown in FIG. 17B, a plurality of the LED chips 4 are spacedly disposed on the substrate 1, e.g., by a reflow process using a flux. Each of the LED chips 4 is disposed in a respective one of the chip areas of the substrate 1 (e.g., a center region of each of the chip areas).

Figure 17C:
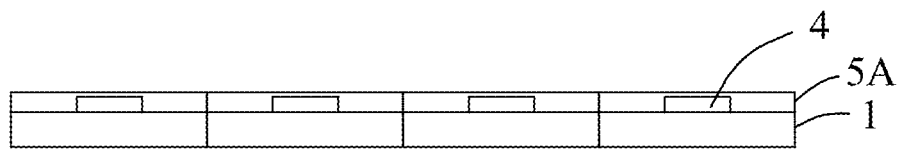

In step S63, as shown in FIG. 17C, the first fluorine-containing layer 5A is formed on the substrate 1, and covers the LED chips 4 by virtue of, e.g., hot pressing or dispensing. The upper surface of the first fluorine-containing layer 5A may be a flat surface, and is slightly higher than the LED chips 4.

Figure 17D:
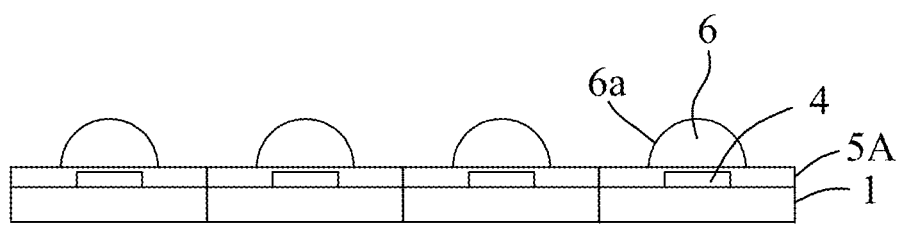

In step S64, as shown in FIG. 17D, a plurality of the optical elements 6 are disposed on the first fluorine-containing layer 5A opposite to the substrate 1 by, e.g., hot pressing, and are located at a position that is above the LED chips 4. A number of the optical elements 6 may be the same as that of the LED chips 4. In such case, each of the optical elements 6 is disposed on a respective one of the LED chips 4. A projection of an area of each of the optical elements 6 on the substrate 1 is not larger than an area of a respective one of the chip areas of the substrate 1, so as to ensure that each of the optical elements 6 is located within the respective one of the chip areas of the substrate 1.

Figure 17E:
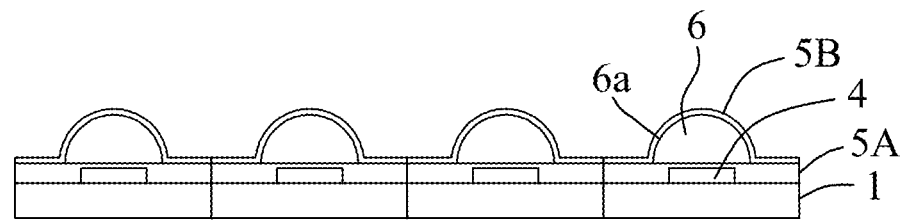

In step S65, as shown in FIG. 17E, the second fluorine-containing layer 5B is formed on the first fluorine-containing layer 5A, and covers at least a portion of the upper surface 61 of the optical element 6 by virtue of, e.g., hot pressing or dispensing.

Figure 17F:
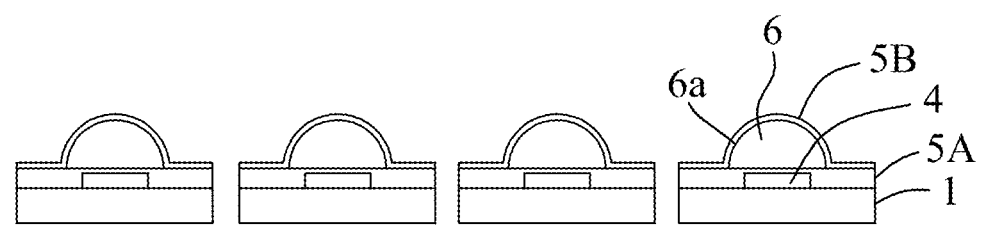

In step S66, as shown in FIG. 17F, the resultant structure obtained in step S65 is diced along the scribing lines on the substrate 1 by, e.g., a mechanical cutting process, and a laser scribing and breaking process, so as to obtain the plurality of the light-emitting packaging devices separated from one another.

In summary, by virtue of the covering member 5 that is made from the fluorine-containing resin, and that covers the LED chip 4 and the at least a portion of the upper surface 61 of the optical element 6, the light-emitting packaging device of this disclosure can have an increased light-emitting efficiency and an improved sealability.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:
1. A light-emitting packaging device, comprising:
   a substrate;
   a light-emitting diode (LED) chip disposed on said substrate;
   an optical element spacedly disposed on said LED chip opposite to said substrate, and having an upper surface and a lower surface that are respectively distal from and proximal to said LED chip; and
   a covering member made from a fluorine-containing resin, and being configured to cover said LED chip and at least a portion of said upper surface of said optical element,
   wherein said substrate is formed with a recess, said recess being defined by a recess-defining wall that has a bottom wall and a surrounding wall extending upwardly from said bottom wall, said covering member being configured to further fill a portion of said recess that is beneath said lower surface of said optical element, wherein said surrounding wall of said recess-defining wall and said upper surface of said optical element cooperatively define a gap, said covering member being configured to further fill said gap, and wherein said light-emitting packaging device further includes a platform unit protruding upwardly from said bottom wall and along said surrounding wall, said optical element being supported by said platform unit.

2. The light-emitting packaging device of claim 1, wherein said optical element further has at least one through hole penetrating from said upper surface to said lower surface, said covering member being configured to further fill said at least one through hole.

3. The light-emitting packaging device of claim 1, wherein said LED chip has an emission peak wavelength that is not greater than 385 nm.

4. The light-emitting packaging device of claim 1, wherein said platform unit is in an annular shape.

5. The light-emitting packaging device of claim 1, wherein only a portion of said optical element is supported by said platform unit, and the remaining portion of said optical element that is free from being supported by said platform unit is in cooperation with said surrounding wall of said recess-defining wall to define said gap, said covering member being configured to further fill said gap.

6. The light-emitting packaging device of claim 1, wherein said platform unit has a height which is greater than that of said LED chip and which is lower than that of said surrounding wall of said recess-defining wall.

7. The light-emitting packaging device of claim 2, wherein said optical element has a plurality of said through holes.

8. The light-emitting packaging device of claim 2, wherein said at least one through hole is located at a position that is above said recess and that is near a peripheral region of said optical element.

9. The light-emitting packaging device of claim 2, wherein said at least one through hole is defined by a hole-defining surface that is roughened and that has a roughness that is not smaller than 0.2 μm.

10. The light-emitting packaging device of claim 1, wherein said optical element includes a base and a lens which extends from said base, and which includes a curved surface serving as said upper surface of said optical element.

11. The light-emitting packaging device of claim 10, wherein said base has a flat surface serving as said lower surface of said optical element, and an imaginary line connecting a geometric center of said optical element to a geometric center of a light-emitting surface of said LED chip is perpendicular to said light-emitting surface of said LED chip.

12. The light-emitting packaging device of claim 10, wherein said optical element further includes a flange which laterally extends from said base, and which is partially supported by said platform unit, and wherein a portion of said flange that is free from being supported by said platform unit is in cooperation with said surrounding wall of said recess-defining wall to define said gap, said covering member being configured to further fill said gap.

13. The light-emitting packaging device of claim 12, wherein a portion of said flange is roughed to have a roughness that is not smaller than 0.2 μm.

14. The light-emitting packaging device of claim 1, wherein said fluorine-containing resin of said covering member is an amorphous fluorine-containing resin having a crystallinity that is not greater than 10%.

15. The light-emitting packaging device of claim 1, wherein said fluorine-containing resin of said covering member includes a copolymer obtained by copolymerization of a perfluorinated oxygen-containing heterocyclic compound and a perfluoroolefin.

16. The light-emitting packaging device of claim 1, wherein said covering member has an imaginary part of complex refractive index that is lower than 0.001 at a wavelength of 300 nm.

17. The light-emitting packaging device of claim 1, wherein said fluorine-containing resin of said covering member is represented by the following formula:

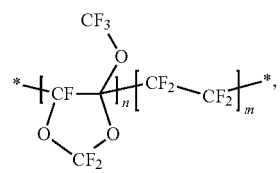

wherein a percentage of n to (n+m) ranges from 40% to 60%.

18. A light-emitting packaging device, comprising:
a substrate;
a light-emitting diode (LED) chip disposed on said substrate;
an optical element spacedly disposed on said LED chip opposite to said substrate, and having an upper surface and a lower surface that are respectively distal from and proximal to said LED chip; and
a covering member made from a fluorine-containing resin, and being configured to cover said LED chip and at least a portion of said upper surface of said optical element,
wherein said fluorine-containing resin of said covering member is represented by the following formula:

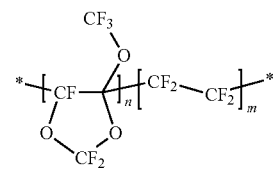

wherein a percentage of n to (n+m) ranges from 40% to 60%.

19. The light-emitting packaging device of claim 18, wherein:
said covering member includes a first fluorine-containing layer and a second fluorine-containing layer, said first fluorine-containing layer being disposed on said substrate and covering said LED chip, and said second fluorine-containing layer being disposed on said first fluorine-containing layer opposite to said substrate and covering said at least a portion of said upper surface of said optical element, and said optical element is disposed on said first fluorine-containing layer opposite to said substrate.

20. The light-emitting packaging device of claim 18, wherein said substrate is formed with a recess, said recess being defined by a recess-defining wall that has a bottom wall and a surrounding wall extending upwardly from said bottom wall, said covering member being configured to further fill a portion of said recess that is beneath said lower surface of said optical element.

21. The light-emitting packaging device of claim 20, wherein said surrounding wall of said recess-defining wall and said upper surface of said optical element cooperatively define a gap, said covering member being configured to further fill said gap.

22. The light-emitting packaging device of claim 20, wherein said optical element is disposed on a top end of said surrounding wall opposite to said bottom wall.

* * * * *